(12) United States Patent
Farooq et al.

(10) Patent No.: US 12,713,961 B2
(45) Date of Patent: Aug. 18, 2026

(54) BONDED STRUCTURE HAVING DIFFUSED METAL OXIDE MATERIAL SURROUNDING MISALIGNED BOND PADS OR BOND PADS OF DIFFERENT SIZES AND METHOD OF MANUFACTURING THEREOF

(71) Applicant: INTERNATIONAL BUSINESS MACHINES CORPORATION, Armonk, NY (US)

(72) Inventors: Mukta Ghate Farooq, Hopewell Junction, NY (US); James J. Kelly, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 515 days.

(21) Appl. No.: 18/319,522

(22) Filed: May 18, 2023

(65) Prior Publication Data

US 2024/0387426 A1 Nov. 21, 2024

(51) Int. Cl.

*H10W 72/90* (2026.01)
*H10W 99/00* (2026.01)
*H10W 80/00* (2026.01)
*H10W 90/00* (2026.01)

(52) U.S. Cl.

CPC .......... *H10W 72/90* (2026.01); *H10W 99/00* (2026.01); *H10W 72/951* (2026.01); *H10W 72/952* (2026.01); *H10W 80/312* (2026.01); *H10W 80/327* (2026.01); *H10W 90/792* (2026.01)

(58) Field of Classification Search

CPC ......... H01L 24/03; H01L 24/05; H01L 24/08; H01L 24/80; H01L 2224/05611; H01L 2224/05624; H01L 2224/05647; H01L 2224/05649; H01L 2224/05666; H01L 2224/0567; H01L 2224/08145; H01L 2224/80379; H01L 2224/80895; H01L 2224/80896; H10W 72/019; H10W 72/90; H10W 72/951; H10W 72/952; H10W 80/312; H10W 80/327; H10W 90/792; H10W 99/00

See application file for complete search history.

(56) References Cited

U.S. PATENT DOCUMENTS

| | | | |
|---|---|---|---|
| 9,064,937 B2 | 6/2015 | Edelstein | |
| 9,728,521 B2 | 8/2017 | Tsai | |
| 10,115,698 B2 * | 10/2018 | Gondcharton et al. | H01L 24/83 |
| 10,128,175 B2 | 11/2018 | Lin | |
| 10,192,829 B2 | 1/2019 | Briggs | |
| 10,204,829 B1 * | 2/2019 | Amnapu et al. | H01L 21/76858 |
| 10,777,534 B2 | 9/2020 | Huang | |
| 11,031,285 B2 * | 6/2021 | Katkar et al. | H01L 27/76843 |

(Continued)

*Primary Examiner* — Wael M Fahmy
*Assistant Examiner* — Alice W Tang
(74) *Attorney, Agent, or Firm* — Yuanmin Cai

(57) ABSTRACT

Embodiments of present invention provide a semiconductor structure. The semiconductor structure includes a first copper pad embedded in a first dielectric layer; a second copper pad embedded in a second dielectric layer; and an oxygen-containing inter-layer, where a portion of the oxygen-containing inter-layer is directly between the first copper pad and the second dielectric layer and includes a first alloy element of manganese, aluminum, zirconium, titanium, tin, or a combination thereof. A method of forming the same is also provided.

20 Claims, 3 Drawing Sheets

(56) References Cited

U.S. PATENT DOCUMENTS

| | | | |
|---|---|---|---|
| 11,164,778 | B2 * | 11/2021 | Wang et al. ...... H01L 21/76846 |
| 11,244,920 | B2 | 2/2022 | Uzoh |
| 11,251,157 | B2 | 2/2022 | Yang |
| 11,515,202 | B2 | 11/2022 | Enquist |
| 2016/0141267 | A1 * | 5/2016 | Hagimoto et al. ...... H01L 24/83 |
| 2022/0130787 | A1 | 4/2022 | Uzoh |

* cited by examiner 30
300
400
302
310
301
330
402
410
430
401

322
312
321
311
412
422
421
411

411m
312m
311m 342
340
443
440
441

BONDED STRUCTURE HAVING DIFFUSED METAL OXIDE MATERIAL SURROUNDING MISALIGNED BOND PADS OR BOND PADS OF DIFFERENT SIZES AND METHOD OF MANUFACTURING THEREOF

BACKGROUND

The present application relates to manufacturing of semiconductor integrated circuits. More particularly, it relates to an electromigration resistant semiconductor structure and method of manufacturing the same.

Electromigration will become a more serious issue as hybrid bonding connection pitch shrinks. This is because fraction of the copper (Cu) and dielectric interface resulting from any misalignment will become appreciable as it is hard to always make perfect alignment.

Cu diffusion from bond pads towards the dielectric can be mitigated by the use of silicon nitride layers. During operation, current moves through the bond pad towards the interface. At places where misalignment exists, the current crowds at the interface and creates EM voids.

EM voids at the interface reduce the Cu available and create a runaway process of more voids. Eventually, the pad fails due to extremely high current densities in a local area. The more misalignment there is, the higher the effective current density. This problem is further magnified when the relative misalignment is more. For example, for a 10 um CD pad, a 1 um misalignment either side is not as bad as for a 5 um pad. Current density increasing locally also leads to hot spots before full EM failures. As pad size decreases, current densities will increase, and misalignment will become a larger fraction of the pad size.

SUMMARY

Embodiments of present invention provide a semiconductor structure. The semiconductor structure includes a first bond pad embedded in a first dielectric layer in a first substrate; a second bond pad embedded in a second dielectric layer in a second substrate; and an oxygen-containing inter-layer bonding the first substrate with the second substrate, where at least a portion of the oxygen-containing inter-layer is directly between the first bond pad in the first substrate and the second dielectric layer in the second substrate, the portion of the oxygen-containing inter-layer including a first alloy element. By having the first alloy element in a first area between the first bond pad and the second dielectric layer, electromigration life of the semiconductor structure is greatly improved. In other words, the first alloy element helps improve the electromigration performance of the first area. Generally, the first area is a misaligned area or a mismatched area.

In one embodiment, the portion of the oxygen-containing inter-layer is a first portion of the oxygen-containing inter-layer, a second portion of the oxygen-containing inter-layer is directly between the first dielectric layer in the first substrate and the second bond pad in the second substrate, the second portion of the oxygen-containing inter-layer including a second alloy element. Similar to the first area, the second alloy element in a second area between the first dielectric layer and the second bond pad helps improve the electromigration performance of the second area. Generally, the second area is a misaligned area or a mismatched area.

In another embodiment, the first and the second bond pad are a first and a second copper pad, the first copper pad is directly bonded to the second copper pad.

In yet another embodiment, the first and the second alloy element are an alloy element selected from a group consisting of manganese, aluminum, zirconium, titanium, tin, or a combination thereof.

In one embodiment, the first and the second portion of the oxygen-containing inter-layer include manganese-oxide, aluminum-oxide, zirconium-oxide, titanium-oxide, or tin-oxide. In another embodiment, the oxygen-containing inter-layer is a layer of silicon-oxynitride, or a bilayer of silicon-nitride and oxygen doped silicon-carbide.

In one embodiment, a third portion of the oxygen-containing inter-layer is directly between the first dielectric layer in the first substrate and the second dielectric layer in the second substrate.

Embodiments of present invention provide a semiconductor structure, which includes a first copper pad embedded in a first dielectric layer; a second copper pad embedded in a second dielectric layer; and an oxygen-containing inter-layer, where a portion of the oxygen-containing inter-layer is directly between the first copper pad and the second dielectric layer and includes a first alloy element of manganese, aluminum, zirconium, titanium, tin, or a combination thereof.

Embodiments of present invention further provide a method. The method includes providing a first and a second substrate; forming a first oxygen-containing inter-layer on the first substrate and forming a second oxygen-containing inter-layer on the second substrate; forming a first copper pad with a first alloy element in the first substrate and forming a second copper pad with a second alloy element in the second substrate; attaching the first substate to the second substrate by bonding the first copper pad with the second copper pad and bonding the first oxygen-containing inter-layer with the second oxygen-containing inter-layer, wherein at least a portion of the first copper pad is bonded directly with the second oxygen-containing inter-layer in a first region; and annealing the first and the second substrate to segregate the first alloy element from the first copper pad into the first region.

According to one embodiment, the annealing causes the first alloy element to migrate to the first region between the first copper pad and the second substrate, which is generally a misaligned area. The electromigration life of the overall structure may be improved by enabling the segregation of the first alloy element to the misaligned area or areas.

In one embodiment, attaching the first substrate to the second substrate further includes subjecting the first and the second substrate to a first temperature of about 25 to 50 degrees Celsius for a duration between about 10 seconds to about 120 seconds while bonding the first copper pad with the second copper pad and bonding the first oxygen-containing inter-layer with the second oxygen-containing inter-layer.

In another embodiment, annealing the first and the second substrate includes subjecting the first and the second substrate to a second temperature between 350 and 400 degrees Celsius for a duration between about 1 minute and about 120 minutes.

In one embodiment, the first and the second oxygen-containing inter-layers are a layer of silicon-oxynitride or a bilayer of silicon-nitride and oxygen doped silicon-carbide. In another embodiment, the first and the second alloy element are manganese, aluminum, zirconium, titanium, tin, or a combination thereof.

In one embodiment, forming the first copper pad with the first alloy element includes forming an alloy seed layer containing the first alloy element in an opening in the first substrate and performing an electroplating of copper on top of the alloy seed layer.

In another embodiment, at least a portion of the second copper pad is bonded directly with the first oxygen-containing inter-layer in a second region, and at least some of the second alloy element is segregated from the second copper pad into the second region. Similar to the first region, segregating the second alloy element from the second copper pad into the second region, which is generally a misaligned area or a mismatched area, helps improve the electromigration performance in the second region.

In yet another embodiment, the first region is between the first copper pad and the second substrate surrounding the second copper pad, and the second region is between the first substrate surrounding the first copper pad and the second copper pad.

BRIEF DESCRIPTION OF THE DRAWINGS

The present invention will be understood and appreciated more fully from the following detailed description of embodiments of present invention, taken in conjunction with accompanying drawings of which.

Figure 1:
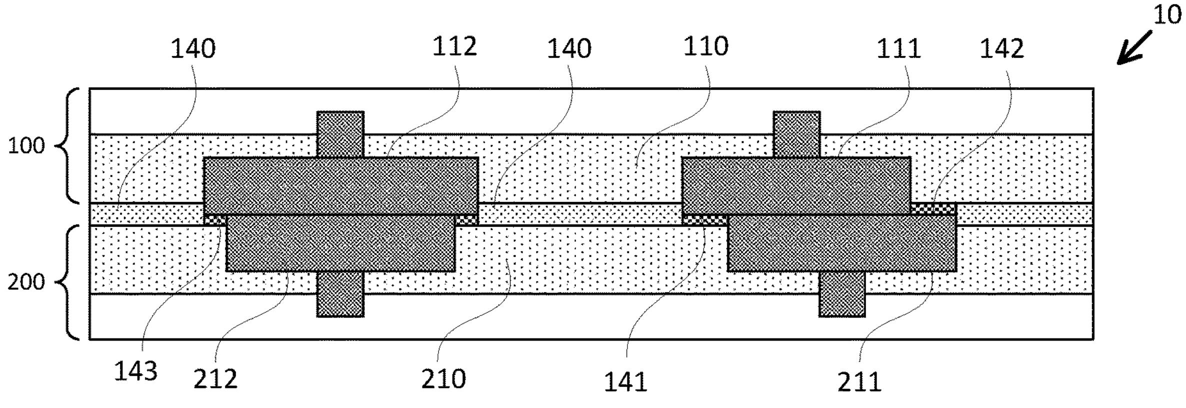
FIG. 1 is a demonstrative illustration of cross-sectional view of a semiconductor structure according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure according to one embodiment of present invention. More specifically, FIG. 1 illustrates a semiconductor structure 10 that includes a first substrate 100 and a second substrate 200 being attached to each other or bonded together. The first substrate 100 may include one or more bond pads such as, for example, a first bond pad 111 and a second bond pad 112. Similarly, the second substrate 200 may include one or more bond pads such as, for example, a third bond pad 211 and a fourth bond pad 212. In one embodiment, the first, the second, the third, and/or the fourth bond pad 111, 112, 211, and 212 may be a copper pad. The first and the second bond pad 111 and 112 may be embedded in a first dielectric layer 110 in the first substrate 100 and the third and the fourth bond pad 211 and 212 may be embedded in a second dielectric layer 210 in the second substrate 200. In other words, the first dielectric layer 110 surrounds the first and the second bond pads 111 and 112 and the second dielectric layer 210 surrounds the third and the fourth bond pads 211 and 212.

In one embodiment, the first and the second substrate 100 and 200 may be attached together or bonded together through an interposed bonding layer. In one embodiment, the interposed bonding layer may be an "inter-layer" such as an oxygen-containing inter-layer 140 and may be, for example, a layer of silicon-oxynitride (SiON) or a bilayer of silicon-nitride (SiN) and oxygen doped silicon-carbide (SiC). The first and second bond pads 111 and 112 in the first substrate 100 may be largely bonded to the respective third and fourth bond pads 211 and 212 in the second substrate 200. In other words, a majority of the first bond pad 111 and a majority of the second bond pad 112 are bonded directly to the third bond pad 211 and the fourth bond pad 212 respectively.

In one embodiment, a portion or some portions of the bond pads in one substrate may be bonded to the dielectric layer in the other substrate via the oxygen-containing inter-layer 140 due to, for example, misalignment and/or mismatch in size of the respective bond pads. For example, a portion of the first bond pad 111 in the first substrate 100 may be bonded to the second dielectric layer 210 in the second substrate 200 and a portion of the third bond pad 211 in the second substrate 200 may be bonded to the first dielectric layer 110 in the first substrate 100, via the oxygen-containing inter-layer 140, resulting in a first region 141 and a second region 142 due to misalignment between the first bond pad 111 and the third bond pad 211. Further for example, a portion of the second bond pad 112 in the first substrate 100 may be bonded to the second dielectric layer 210 in the second substrate 200, via the oxygen-containing inter-layer 140, resulting in a third region 143 due to mismatch in size between the second bond pad 112 and the fourth bond pad 212. By the nature that the first, the second, and the third region 141, 142, and 143 are generally caused by misalignment and/or mismatch. In one embodiment, the overall sizes of the first, the second, and the third region 141, 142, and 143 are normally equal to or less than 5% of their corresponding bond pad sizes.

The first, the second, and the third region 141, 142, and 143 may include one or more alloy elements such as, for example, manganese (Mn), aluminum (Al), zirconium (Zr), titanium (Ti), and tin (Sn) and these alloy elements may exist in the form of oxide thereof. For example, the first, the second, and the third region 141, 142, and 143 may include manganese-oxide (MnO), aluminum-oxide (AlO), zirconium-oxide (ZrO), titanium-oxide (TiO), and/or tin-oxide (SnO). Concentration of these alloy elements in the first, second, and third regions 141, 142, and 143 may be high relative to concentration of corresponding alloy elements in the first bond pad 111 and/or the third bond pad 211, and in the second bond pad 112 and/or the fourth bond pad 212.

Embodiments of present invention provide a semiconductor structure with region or regions in the misaligned or mismatched areas having high concentration of the above alloy elements, and a method of forming the same as being described below in more details, such that these region or regions may become more resistant to electromigration, which in-turn helps prevent electromigration related damages from happening, should such misalignment and/or mismatch happens or are caused in these areas during a process of bonding the involved substrates together.

Figures 2A, 2B, 2C, 2D:
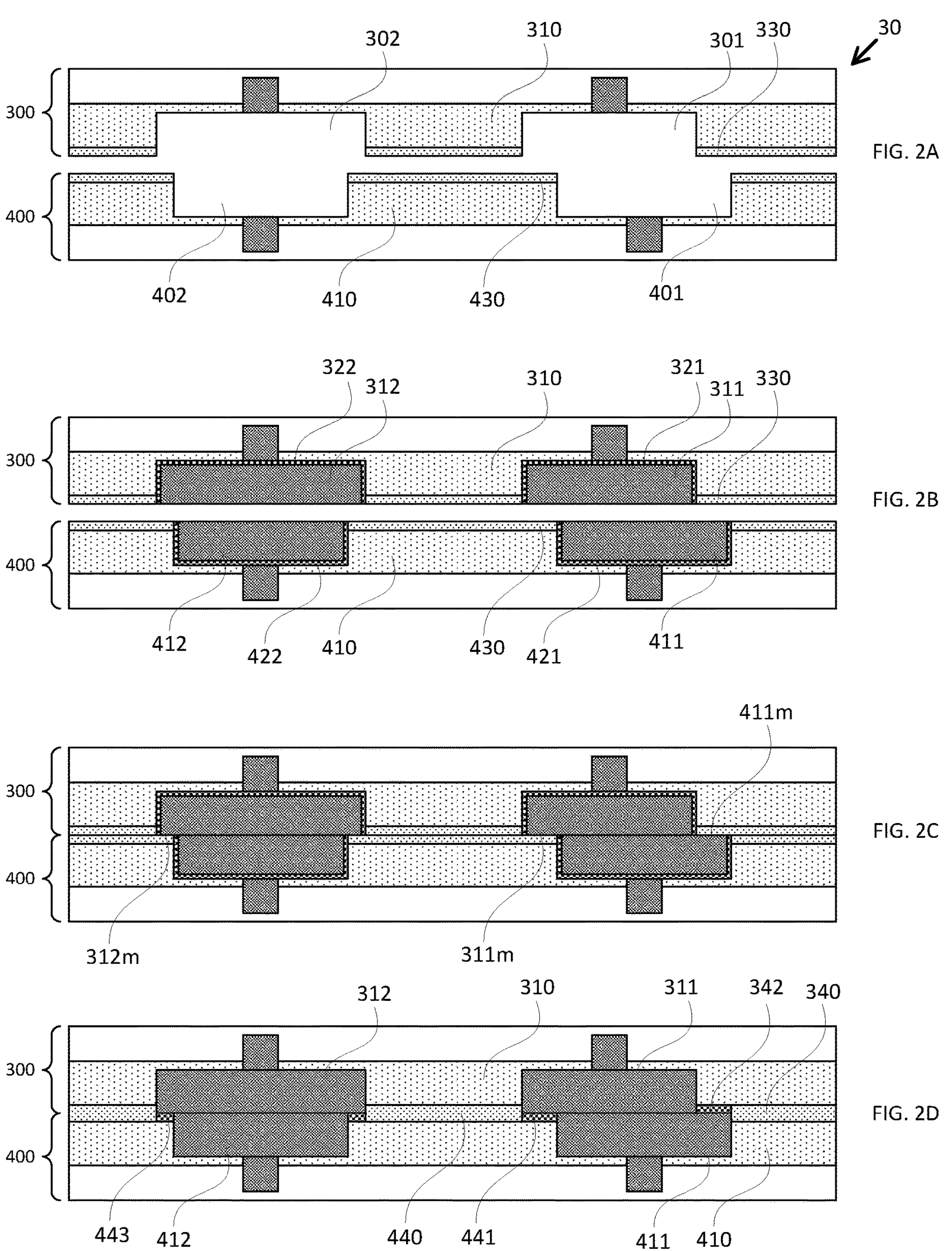
FIGS. 2A, 2B, 2C, and 2D are demonstrative illustrations of cross-sectional views of a semiconductor structure in steps of manufacturing thereof according to one embodiment of present invention.

FIGS. 2A, 2B, 2C, and 2D are demonstrative illustrations of cross-sectional views of a semiconductor structure in steps of manufacturing thereof according to one embodiment of present invention. More particularly, in forming a semiconductor structure 30, embodiments of present invention provide preparing a first substrate 300 and a second substrate 400 before bonding them together. As is illustrated in FIG. 2A, embodiments of present invention include providing or receiving the first substrate 300 with a first dielectric layer 310 at a top thereof; and forming an oxygen-containing inter-layer 330 on top of the first dielectric layer 310. The oxygen-containing inter-layer 330 may be, for example, a layer of silicon-oxynitride or a bilayer of silicon-nitride and an oxygen doped silicon-carbide. Embodiments of present invention further provide creating one or more openings, such as openings 301 and 302, in the first dielectric layer 310 and through the oxygen-containing inter-layer 330. A barrier layer (not shown) may be deposited in the openings 301 and 302 lining sidewall and bottom surfaces of the openings 301 and 302. The barrier layer may be, for example, a layer of titanium (Ti), titanium-oxide (TiO), titanium-nitride (TiN), tantalum (Ta), tantalum-oxide (TaO), tantalum-nitride (TaN), or a combination thereof and may prevent bond pad materials, to be formed in the openings, from diffusing into surrounding dielectric layer.

Similar to preparing the first substrate 300, embodiments of present invention provide preparing the second substrate 400 by forming an oxygen-containing inter-layer 430 on top of a second dielectric layer 410 in the second substrate 400; creating one or more openings 401 and 402 in the second dielectric layer 410, through the oxygen-containing inter-layer 430; and lining the one or more openings 401 and 402 with a barrier layer (not shown) of Ti, TiO, TIN, Ta, TaO, TaN, or a combination thereof.

As is illustrated in FIG. 2B, embodiments of present invention further provide forming or depositing an alloy seed layer 321 and 322 in the openings 301 and 302 respectively. The alloy seed layer 321 and 322 may be, for example, a layer of copper alloyed with manganese, aluminum, zirconium, titanium, tin, or a combination thereof. The alloy seed layer 321 and 322 may be formed to have a thickness around 100 nm or less. Following the formation of the alloy seed layer 321 and 322, a layer of bond pad material may be formed inside the openings 301 and 302 to form the first and the second bond pad 311 and 312. For example, a layer of copper may be electroplated into the openings 301 and 302, which is then followed by a low temperature annealing process at, for example, about 100 to 250 degrees Celsius for about 2 to 60 minutes. A chemical-mechanical-polishing (CMP) process may subsequently be applied to remove excessive bond pad material on top of the opening 301 and 302, thereby forming the first and the second bond pad 311 and 312.

Similarly, an alloy seed layer 421 and 422 may be formed or deposited on top of the barrier layer in the openings 401 and 402 in the second dielectric layer 410 in the second substrate 400, and a third and a fourth bond pads 411 and 412 may be formed in the openings 401 and 402 through an electroplating process, followed by a low temperature annealing process, and then a CMP process, on top of the alloy seed layer 421 and 422.

After preparing the first substrate 300 and the second substrate 400, as is illustrated in FIG. 2B, embodiments of present invention provide bonding or attaching the first substrate 300 to the second substrate 400 as is illustrated in FIG. 2C. The bonding may be performed in a low temperature environment such as, for example, around 25 to 50 degrees Celsius, for about 10 seconds up to a few minutes such as 2 minutes. During the bonding process, misalignment such as misalignment 311*m* and 411*m* between the first bond pad 311 and the third bond pad 411 may happen. In some instances, the corresponding bond pads may not have an exact same size to match each other resulting in one or more mismatches such as, for example, a mismatch 312*m* between the second bond pad 312 and the fourth bond pad 412.

According one embodiment of present invention, the semiconductor structure 30 may then be subjected to a high temperature annealing process to promote segregation of the one or more alloy elements in the alloy seed layer 312, 322, 412, and 422. More specifically, the one or more alloy elements may segregate from their respective bond pads 311, 312, 411, and 412 into the one or more misaligned and/or mismatched areas 311*m*, 411*m*, and 312*m*, thereby forming regions 441, 442, and 443 as is illustrated in FIG. 2D. More particularly, the regions 441, 442, and 443 may include one or more of the alloy elements such as Mn, Al, Zr, Ti, Sn, or a combination thereof, and may have a concentration of these alloy elements that is relatively higher than the surrounding areas. In other words, the oxygen elements in the oxygen-containing inter-layers 330 and 430, coupled with the high temperature annealing may cause the alloy elements to segregate from the bond pads into the misaligned and/or mismatched area 311*m*, 411*m*, and 312*m* to form regions 441, 442, and 443. The high temperature annealing process may be performed at, for example, 350 to 400 degrees Celsius and for a duration of about 1 minute to a few hours such as 2 hours (120 minutes), and the thereby formed regions 441, 442, and 443 may contain oxides and/or silicates of the alloy elements such as MnO, AIO, ZrO, TiO, and/or SnO (and in the case of silicates, e.g., MnSiO). The oxide and/or silicate of the alloy elements in the regions 441, 442, and 443 at the misaligned or mismatched areas helps to increase resistance of these misaligned or mismatched areas to electromigration and thus reduce or avoid damage which may be caused by such potential electromigration.

Figure 3:
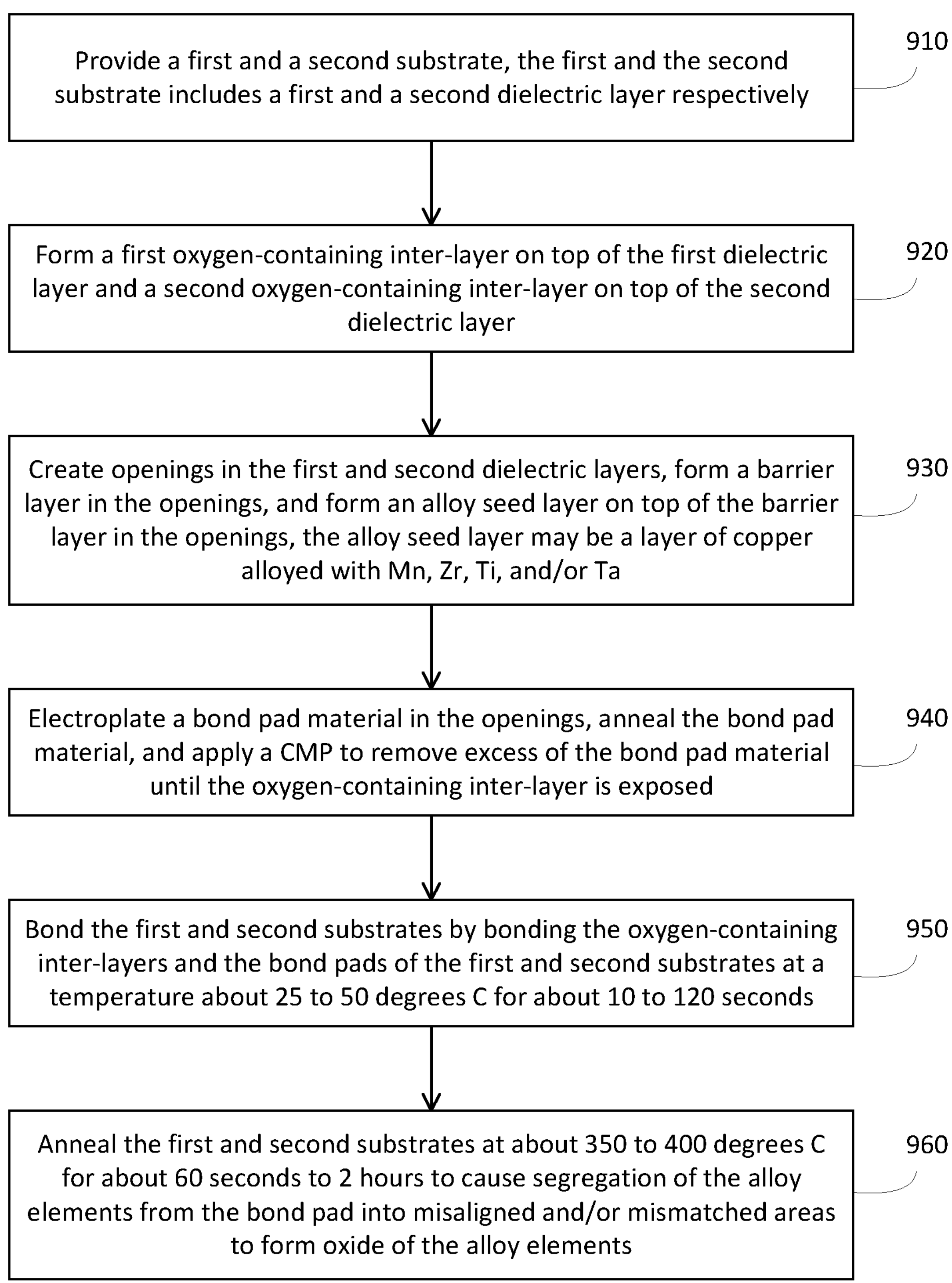
FIG. 3 is a simplified illustration of a flow-chart of a method of manufacturing a semiconductor structure according to embodiments of present invention.

FIG. 3 is a simplified illustration of a flow-chart of a method of manufacturing a semiconductor structure according to one embodiment of present invention. The method includes (910) providing a first and a second substrate, where the first and the second substrate may include a first dielectric layer and a second dielectric layer respectively; (920) forming a first oxygen-containing inter-layer on top of the first dielectric layer of the first substrate and a second oxygen-containing inter-layer on top of the second dielectric layer of the second substrate; (930) creating openings for forming bond pads in the first and the second dielectric layer, and forming a barrier layer in the openings and an alloy seed layer on top of the barrier layer, where the alloy seed layer may be a layer of copper alloyed with Mn, Al, Zr, Ti, Sn, or a combination thereof; (940) electroplating a bond pad material, such as copper, in the openings in the first and the second substrate on top of the alloy seed layer, annealing the plated bond pad material, and subsequently applying a chemical-mechanical-polishing (CMP) process to remove any excess of the bond pad material above the openings and to expose the first and the second oxygen-containing inter-layer; (950) bonding the first and the second substrate by bonding the oxygen-containing inter-layers and the respective bond pads in the first and the second substrate, where the bonding may be performed in a low temperature, such as room temperature of about 25 to 50 degrees Celsius; (960) performing an anneal process of the bonded first and second substrates at a temperature around 350 to 400 degrees Celsius to cause segregation of the alloying elements in the alloy seed layer from the bond pads into any misaligned areas/regions and/or mismatched areas/regions to form oxide and/or silicates thereof. Such formed oxides and/or silicates, for example MnO, AIO, ZrO, TiO, and/or SnO, are electromigration resistant, thereby may prevent the semiconductor structure from failure due to potential electromigration occurring at the misaligned and/or mismatched areas between the bond pads in the first substrate and the bond pads in the second substrate.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:

a first bond pad embedded in a first dielectric layer in a first substrate;

a second bond pad embedded in a second dielectric layer in a second substrate; and an oxygen-containing inter-layer bonding the first substrate with the second substrate, wherein at least a first portion of the oxygen-containing inter-layer vertically fully and directly contacts the first bond pad in the first substrate and the second dielectric layer in the second substrate and horizontally fully and directly contacts the second bond pad and a third portion of the oxygen-containing inter-layer, the first portion of the oxygen-containing inter-layer including a first alloy element such that it is materially different from the third portion of the oxygen-containing inter-layer.

2. The semiconductor structure of claim 1, wherein a second portion of the oxygen-containing inter-layer is vertically directly between the first dielectric layer in the first substrate and the second bond pad in the second substrate and horizontally directly between the first bond pad and a fourth portion of the oxygen-containing inter-layer, the second portion of the oxygen-containing inter-layer being materially different from the fourth portion of the oxygen-containing inter-layer to include a second alloy element.

3. The semiconductor structure of claim 2, wherein the first and the second bond pad are made of copper to be a first and a second copper pad respectively, and the first copper pad is directly bonded to the second copper pad.

4. The semiconductor structure of claim 2, wherein the first and the second alloy element are an alloy element selected from a group consisting of manganese, aluminum, zirconium, titanium, tin, or a combination thereof.

5. The semiconductor structure of claim 2, wherein the first and the second portion of the oxygen-containing inter-layer include manganese-oxide, aluminum-oxide, zirconium-oxide, titanium-oxide, or tin-oxide.

6. The semiconductor structure of claim 1, wherein the third portion of the oxygen-containing inter-layer is a layer of silicon-oxynitride, or a bilayer of silicon-nitride and oxygen doped silicon-carbide.

7. The semiconductor structure of claim 1, wherein the third portion of the oxygen-containing inter-layer is vertically directly between the first dielectric layer in the first substrate and the second dielectric layer in the second substrate.

8. A semiconductor structure comprising:

a first copper pad embedded in a first dielectric layer;

a second copper pad embedded in a second dielectric layer; and an oxygen-containing inter-layer, wherein a portion of the oxygen-containing inter-layer vertically directly contacts the first copper pad and the second dielectric layer and horizontally directly contacts another portion of the oxygen-containing inter-layer that is directly between and contacts the first dielectric layer and the second dielectric layer, the portion of the oxygen-containing inter-layer is materially different from the another portion of the oxygen-containing inter-layer and includes a first alloy element of manganese, aluminum, zirconium, titanium, tin, or a combination thereof.

9. The semiconductor structure of claim 8, wherein the portion of the oxygen-containing inter-layer is a first portion of the oxygen-containing inter-layer, further comprising a second portion of the oxygen-containing inter-layer, the second portion of the oxygen-containing inter-layer is directly between the first dielectric layer and the second copper pad, is materially different from the another portion of the oxygen-containing inter-layer, and includes a second alloy element.

10. The semiconductor structure of claim 8, wherein the another portion of the oxygen-containing inter-layer that is directly between the first dielectric layer and the second dielectric layer horizontally surrounds a portion of the first copper pad and a portion of the second copper pad.

11. The semiconductor structure of claim 8, wherein the another portion of the oxygen-containing inter-layer is a layer of silicon-oxynitride, or a bilayer of silicon-nitride and oxygen doped silicon-carbide.

12. The semiconductor structure of claim 8, wherein a majority of the first copper pad is bonded directly to the second copper pad.

13. A method comprising:

providing a first and a second substrate;

forming a first oxygen-containing inter-layer on the first substrate and forming a second oxygen-containing inter-layer on the second substrate;

forming a first copper pad with a first alloy element in the first substrate and forming a second copper pad with a second alloy element in the second substrate;

attaching the first substrate to the second substrate by bonding the first copper pad with the second copper pad and bonding the first oxygen-containing inter-layer with the second oxygen-containing inter-layer, wherein at least a portion of the first copper pad is bonded directly with the second oxygen-containing inter-layer in a first region of the second oxygen-containing inter-layer; and annealing the first and the second substrate to segregate the first alloy element from the first copper pad into the first region, causing the first region to be materially different from another region of the second oxygen-containing inter-layer that directly contacts the first region but is not directly bonded with the first copper pad, wherein the first region directly contacts the first copper pad and the second substrate.

14. The method of claim 13, wherein attaching the first substrate to the second substrate further comprises subjecting the first and the second substrate to a first temperature of about 25 to 50 degrees Celsius for a duration between about 10 seconds to about 120 seconds while bonding the first copper pad with the second copper pad and bonding the first oxygen-containing inter-layer with the second oxygen-containing inter-layer.

15. The method of claim 14, wherein annealing the first and the second substrate comprises subjecting the first and the second substrate to a second temperature between 350 and 400 degrees Celsius for a duration between about 1 minute and about 120 minutes.

16. The method of claim 13, wherein the first and the second oxygen-containing inter-layers are a layer of silicon-oxynitride or a bilayer of silicon-nitride and oxygen doped silicon-carbide.

17. The method of claim 13, wherein the first and the second alloy element are manganese, aluminum, zirconium, titanium, tin, or a combination thereof and are materially different from each other.

18. The method of claim 13, wherein forming the first copper pad with the first alloy element comprises forming an alloy seed layer containing the first alloy element in an opening in the first substrate and performing an electroplating of copper on top of the alloy seed layer.

19. The method of claim 13, wherein at least a portion of the second copper pad is bonded directly with the first oxygen-containing inter-layer in a second region, and at least some of the second alloy element is segregated from the second copper pad into the second region.

20. The method of claim 19, wherein the first region is between the first copper pad and the second substrate surrounding the second copper pad wherein the second copper pad partially protrudes from the second substrate, and the second region is between the first substrate surrounding the first copper pad and the second copper pad wherein the first copper pad partially protrudes from the first substrate.

* * * * *